United States Patent
Oh et al.

(10) Patent No.: US 10,008,247 B2
(45) Date of Patent: Jun. 26, 2018

(54) MEMORY DEVICE FOR PERFORMING MULTI-CORE ACCESS TO BANK GROUPS

(71) Applicant: SAMSUNG ELECTRONICS CO., LTD., Suwon-si, Gyeonggi-Do (KR)

(72) Inventors: Tae Young Oh, Seoul (KR); Ho Sung Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 52 days.

(21) Appl. No.: 15/205,038

(22) Filed: Jul. 8, 2016

(65) Prior Publication Data

US 2016/0322088 A1 Nov. 3, 2016

Related U.S. Application Data

(63) Continuation of application No. 13/888,409, filed on May 7, 2013, now Pat. No. 9,396,771.

(Continued)

(30) Foreign Application Priority Data

Mar. 15, 2013 (KR) .................. 10-2013-0028049

(51) Int. Cl.
*G11C 7/22* (2006.01)
*G11C 7/10* (2006.01)
(Continued)

(52) U.S. Cl.
CPC ............ *G11C 7/222* (2013.01); *G11C 7/1006* (2013.01); *G11C 7/1012* (2013.01);
(Continued)

(58) Field of Classification Search
None
See application file for complete search history.

(56) References Cited

U.S. PATENT DOCUMENTS 6,151,271 A 11/2000 Lee
7,006,404 B1 2/2006 Manapat et al.
(Continued)

FOREIGN PATENT DOCUMENTS

KR 1020080049674 A 6/2008
KR 1020080059031 A 6/2008
(Continued)

OTHER PUBLICATIONS

Koo et al, "A 1.2V 38nm 2.4Gb/s/pin 2Gb DDR4 SDRAM with Bank Group and x4 Half-Page Architecture," 2012 IEEE International Solid-State Circuits Conference, pp. 40-41.

*Primary Examiner* — Douglas King
(74) *Attorney, Agent, or Firm* — Volentine, Whitt & Francos, PLLC

(57) ABSTRACT

A memory device has a burst length "b", performs "k" core accesses per command, and receives a command, where "b" is an integer of at least 2 and "k" is an integer of at least 2 and at most "b". The memory device includes a memory cell array including a plurality of bank groups, a plurality of bank group control units respectively corresponding to the plurality of bank groups, each of the bank group control units configured to generate a multiplexer control signal for selecting part of data read from a corresponding bank group, and a multiplexer configured to sequentially output data read from the plurality of bank groups according to the multiplexer control signal output from the plurality of bank group control units. Data items included in output data of the multiplexer have a same time space.

10 Claims, 10 Drawing Sheets

Related U.S. Application Data

(60) Provisional application No. 61/643,455, filed on May 7, 2012.

(51) Int. Cl.
    *G11C 8/12*    (2006.01)
    *G11C 8/10*    (2006.01)

(52) U.S. Cl.
    CPC .......... *G11C 7/1039* (2013.01); *G11C 7/1048* (2013.01); *G11C 8/10* (2013.01); *G11C 8/12* (2013.01); *G11C 2207/107* (2013.01)

(56) References Cited

U.S. PATENT DOCUMENTS

| | | |
|---|---|---|
| 7,136,987 B2 | 11/2006 | Chen |
| 8,125,847 B2 | 2/2012 | Kim et al. |
| 2002/0085417 A1 | 7/2002 | Pekny et al. |
| 2003/0185075 A1* | 10/2003 | Park .................. G11C 7/1072 365/203 |
| 2004/0246783 A1* | 12/2004 | Lee .................. G11C 7/1027 365/189.05 |
| 2009/0010044 A1 | 1/2009 | Sakimura et al. |
| 2009/0268528 A1 | 10/2009 | Kim et al. |
| 2012/0008451 A1 | 6/2012 | Cha et al. |

FOREIGN PATENT DOCUMENTS

| | | |
|---|---|---|
| KR | 1020090126611 A | 12/2009 |
| KR | 1020100050953 A | 5/2010 |
| KR | 1020110081814 A | 7/2011 |
| KR | 1020110111219 A | 10/2011 |

\* cited by examiner

MEMORY DEVICE FOR PERFORMING MULTI-CORE ACCESS TO BANK GROUPS

CROSS-REFERENCE TO RELATED APPLICATIONS

This application is a Continuation of U.S. application Ser. No. 13/888,409, filed May 7, 2013, now U.S. Pat. No. 9,396,771 issued on Jul. 19, 2016, which makes a claim of priority under 35 U.S.C. § 119 to U.S. Provisional Patent Application 61/643,455 filed on May 7, 2012, and to Korean Patent Application No. 10-2013-0028049 filed on Mar. 15, 2013, the disclosures of which are hereby incorporated by reference in their entireties.

BACKGROUND

Embodiments of the inventive concept generally relate to data memory devices, and more particularly, to memory devices which execute multi-core access to a plurality of bank groups.

With the increase of memory speed, bank group configurations have been increasingly utilized in order to maintain a core access speed and increase a total bandwidth. However, when a bank group is used in a memory device having multiple memory core access functionality, it may not be possible to realize a given burst length defined in a specification. For example, in a memory core of a 2-bit pre-fetch structure, a burst length of 2 can be realized when the bank group is used, but a burst length of 4 cannot be realized.

SUMMARY

According to some embodiments of the inventive concept, a memory device is provided which has a burst length "b", performs "k" core accesses per command, and receives a command, where "b" is an integer of at least 2 and "k" is an integer of at least 2 and at most "b". The memory device includes a memory cell array comprising a plurality of bank groups, a plurality of bank group control units respectively corresponding to the plurality of bank groups, each of the bank group control units configured to generate a multiplexer control signal for selecting part of data read from a corresponding bank group, and a multiplexer configured to sequentially output data read from the plurality of bank groups according to the multiplexer control signal output from the plurality of bank group control units. Data items comprised in output data of the multiplexer have a same time space.

Each of the bank group control units may include a write/read control unit configured to select a command signal corresponding to the bank group from the command, generate as many internal commands as the number of core accesses, and generates a latch control signal comprising a pulse corresponding to operation instruction of each internal command.

Each of the bank group control units may further include a first latch configured to latch the received data to remove a gap between the data items; and a second latch configured to latch output data of the first latch according to the latch control signal to generate the bank group write data in which data items in the output data have the same time space.

According to other embodiments of the inventive concept, a memory device is provided has a burst length of "b", performs "k" core accesses per command, and receives a command and memory write data, where "b" is an integer of at least 2 and "k" is an integer of at least 2 and at most "b". The memory device includes a memory cell array comprising a plurality of bank groups, and a plurality of bank group control units respectively corresponding to the plurality of bank groups. Each of the bank group control units configured to receive data corresponding to the bank group among the memory write data, to generate bank group write data by adjusting data items comprised in the received data to be continuous and have a same time space, and to output the bank group write data to the bank group.

The multiplexer control signal may select a part where data read at a first access among the read data is combined with data read at a second access among the read data.

The memory device of claim may further include a third latch configured to output delayed data, which results from delaying data read at a first access among the read data of the bank group, to the multiplexer, wherein the multiplexer control signal is synchronized with the read data.

According to other embodiments of the inventive concept, a system is provided which includes a memory device, and a memory controller controlling the memory device and configured to interface with a host device. The memory device has a burst length "b", performs "k" core accesses per command, and receives a command from the memory controller, where "b" is an integer of at least 2 and "k" is an integer of at least 2 and at most "b". Further, the memory device includes a memory cell array comprising a plurality of bank groups, a plurality of bank group control units respectively corresponding to the plurality of bank groups, each of the bank group control units configured to generate a multiplexer control signal for selecting part of data read from a corresponding bank group, and a multiplexer configured to sequentially output data read from the plurality of bank groups according to the multiplexer control signal output from the plurality of bank group control units. Data items comprised in output data of the multiplexer have a same time space.

BRIEF DESCRIPTION OF THE DRAWINGS

The above and other features and advantages of the inventive concept will become readily apparent from the detailed description that follows, with reference to the accompanying drawings, in which.

DETAILED DESCRIPTION OF THE EMBODIMENTS

Figure 1:
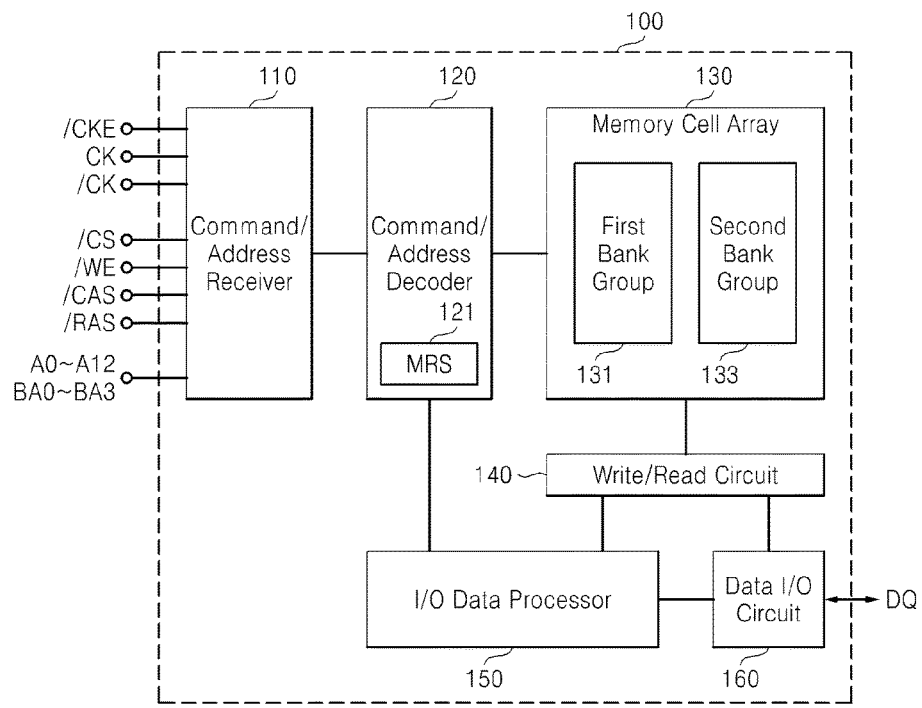
FIG. 1 is a block diagram of a memory device according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory device 100 according to some embodiments of the inventive concept. The memory device 100 includes a command/address receiver 110, a command/address decoder 120, a memory cell array 130, a write/read circuit 140, an input/output (I/O) data processor 150, and a data I/O circuit 160.

The command/address receiver 110 may receive a plurality of control signals /CS, /WE, /CAS, and /RAS and address signals A0 through A12 and BA0 through BA3. Here, /CS is a chip select signal, /WE is a write enable signal, /CAS is a column address strobe signal, and /RAS is a row address strobe signal. The command/address receiver 110 may also receive a clock enable signal /CKE, a clock signal CK, and an inverted clock signal /CK.

The command/address decoder 120 may decode the control signals /CS, /WE, /CAS, and /RAS and the address signals A0 through A12 and BA0 through BA3, and access the memory cell array 130 based on the decoded signals. The command/address decoder 120 may include a mode register 121 which controls whether a bank group is used.

The memory cell array 130 may include a first bank group 131 and a second bank group 133. For convenience of explanation, only two bank groups are illustrated in FIG. 1, but it will be understood more than two bank groups may be included in the memory cell array 130.

The write/read circuit 140 may write data to a memory cell in the first bank group 131 and the second bank group 133, and may verify-read or read data from the memory cell.

The I/O data processor 150 receives a command CMD from the command/address decoder 120. The I/O data processor 150 adjusts the timing of write data received from the data I/O circuit 160 and outputs the write data to the write/read circuit 140 in a write operation. Further, the I/O data processor 150 adjusts the timing of output data received from the write/read circuit 140 and outputs the output data to the data I/O circuit 160 in a read operation. The structure of the I/O data processor 150 will be described below in greater detail with reference to FIGS. 2 and 3.

The data I/O circuit 160 transmits data DQ to the I/O data processor 150 and outputs data DQ from the I/O data processor 150.

Figure 2:
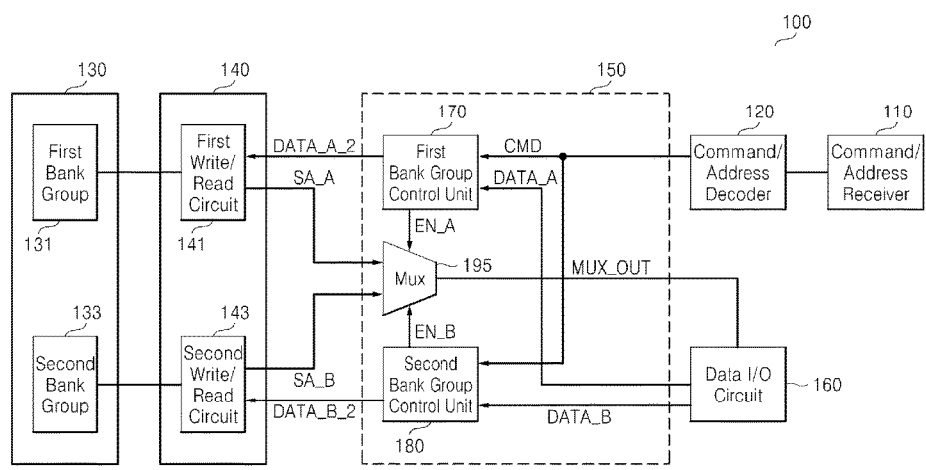
FIG. 2 is a more detailed block diagram of the memory device illustrated in FIG. 1.

FIG. 2 is a more detailed block diagram of the memory device 100 illustrated in FIG. 1. Referring to FIG. 2, the write/read circuit 140 includes a first write/read circuit 141 corresponding to the first bank group 131 and a second write/read circuit 143 corresponding to the second bank group 133. The I/O data processor 150 includes a first bank group control unit 170, a second bank group control unit 180, and a multiplexer (MUX) 195.

The first bank group control unit 170 and the second bank group control unit 180 are provided for the first and second bank groups 131 and 133, respectively, to receive the command CMD from the command/address decoder 120. In the write operation, the first and second bank group control units 170 and 180 respectively receive first write data DATA_A and second write data DATA_B from the data I/O circuit 160, respectively adjust the timing of the write data DATA_A and the timing of the write data DATA_B based on the command CMD, and respectively generate and output bank group write data DATA_A_2 and DATA_B_2 to the first write/read circuit 141 and the second write/read circuit 143. In the read operation, the first and second bank group control units 170 and 180 respectively generate a first MUX control signal EN_A and a second MUX control signal EN_B based on the command CMD and output the first MUX control signal EN_A and the second MUX control signal EN_B to the MUX 195.

In the read operation, the MUX 195 receives first read data SA_A from the first write/read circuit 141 and second read data SA_B from the second write/read circuit 143. The MUX 195 sequentially selects the first read data SA_A and the second read data SA_B to output selected data MUX_OUT to the data I/O circuit 160 according to the MUX control signals EN_A and EN_B respectively received from the first and second bank group control units 170 and 180.

Figure 3:
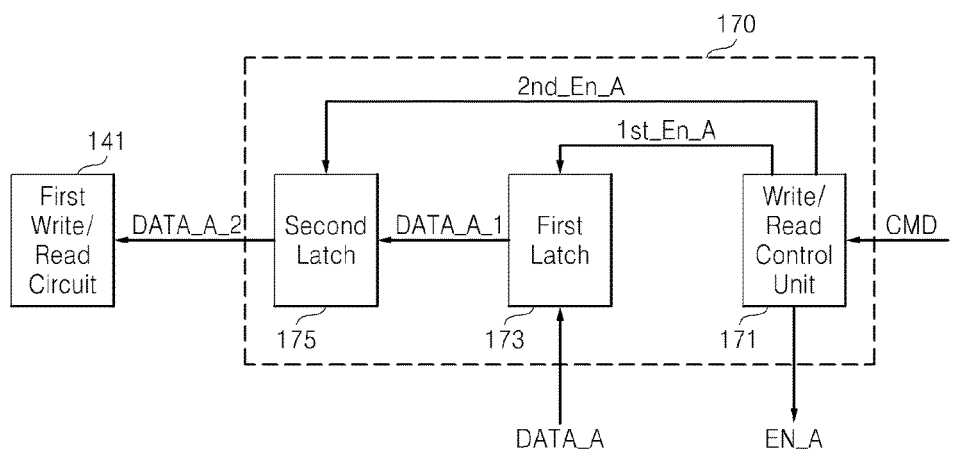
FIG. 3 is a block diagram of a first bank group control unit illustrated in FIG. 2.

FIG. 3 is a detailed block diagram of the first bank group control unit 170 illustrated in FIG. 2 coupled to the first write/read circuit 141 also illustrated in FIG. 2. Referring to FIG. 3, the first bank group control unit 170 includes a write/read control unit 171, a first latch 173, and a second latch 175.

The write/read control unit 171 generates and outputs a latch control signal 2nd_En_A to the second latch 175 based on the command CMD in the write operation. The write/read control unit 171 generates and outputs the first MUX control signal EN_A to the MUX 195 based on the command CMD in the read operation.

The first latch 173 receives the first write data DATA_A, generates first latch data DATA_A_1 by latching the first write data DATA_A so that a gap is removed from the first write data DATA_A according to the clock signal CK, and outputs the first latch data DATA_A_1 to the second latch 175. Alternatively, the first latch 173 may receive a first latch control signal 1st_En_A from the write/read control unit 171 instead of the clock signal CK and may latch the first write data DATA_A according to the first latch control signal 1st_En_A.

The second latch 175 latches the first latch data DATA_A_1 according to the latch control signal 2nd_En_A so that each data item included in the first latch data DATA_A_1 has the same time space, thereby generating the bank group write data DATA_A_2; and outputs the bank group write data DATA_A_2 to the first write/read circuit 141. The operations of the first and second latches 173 and 175 will be described later in greater detail with reference to FIG. 5.

The second bank group control unit 180 of FIG. 2 may have the same structure as the first bank group control unit 170 illustrated in FIG. 3, and may perform the same operations as the first bank group control unit 170.

Figure 4:
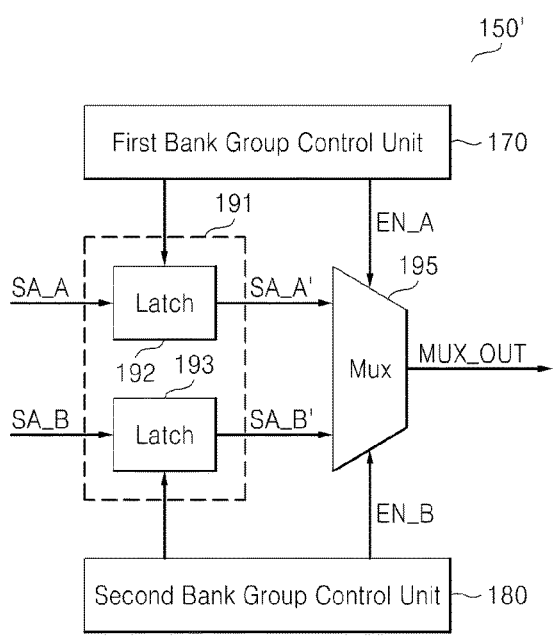
FIG. 4 is a block diagram of an input/output data processor according to some embodiments of the inventive concept.

FIG. 4 is a block diagram of an I/O data processor 150' according to other embodiments of the inventive concept. As compared to the I/O data processor 150 illustrated in FIG. 2, the I/O data processor 150' illustrated in FIG. 4 further includes a third latch 191. The third latch 191 may include a first read latch 192 and a second read latch 193 respectively corresponding to the first and second bank groups 131 and 133. The third latch 191 receives the first read data SA_A and the second read data SA_B and delays and outputs the first and second read data SA_A and SA_B that has been read at the first access to the MUX 195. The operations of the I/O data processor 150' will be described later in greater detail with reference to FIG. 8.

Figure 5:
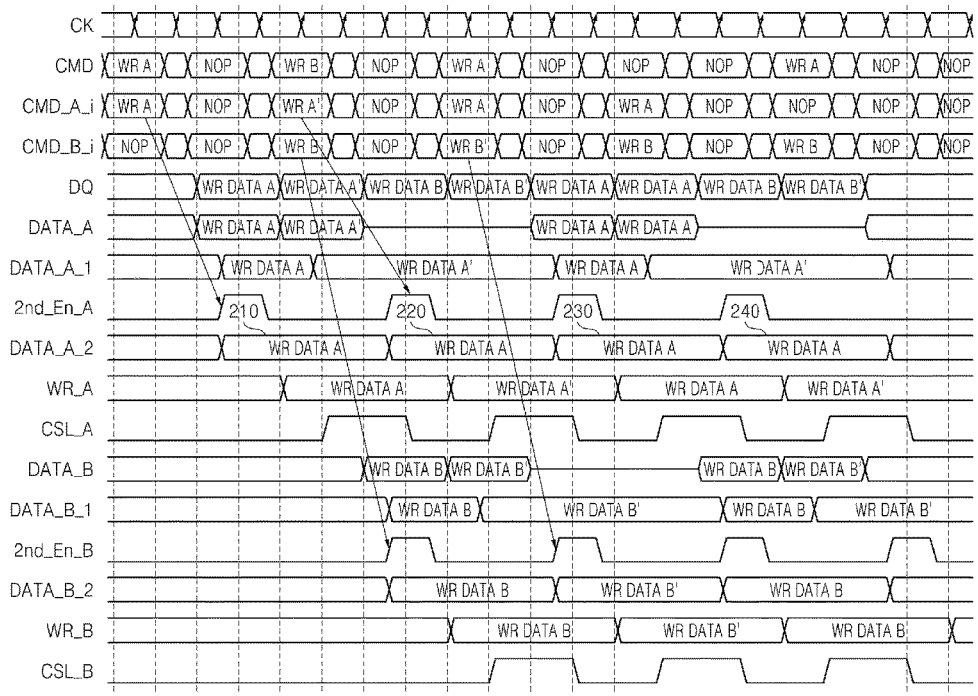
FIG. 5 is a timing chart showing a write operation according to some embodiments of the inventive concept.

FIG. 5 is a timing chart showing a write operation according to some embodiments of the inventive concept. FIG. 5 shows a case where two bank groups are used, tCCDL=4, and tCCDS=2. A column address to column address delay tCCD is a time delay between application of a column address and application of a subsequent column address; tCCDL is a time delay between an access to a selected bank group and an access to the same bank group; and tCCDS is a time delay between an access to the selected bank group and an access to another bank group.

The inventive concept is not restricted to the current embodiments. For instance, the number of bank groups and the value of tCCDL and tCCDS, which are set in a mode register, may be changed by an external command.

A burst length may be a value obtained by multiplying the number of core accesses per command by the number of bank groups. In other words, when the burst length is "b (an integer of at least 2)", the number of core accesses per command is "k (an integer of at least 2 and at most "b")", and the number of bank groups is "n (an integer of at least 2)", b=k*n. In the embodiments illustrated in FIG. 5, the number of bank groups and the number of core accesses per command may be set to 2 in order to support a burst length of 4.

Referring to FIGS. 2, 3, and 5, the first bank group control unit 170 and the second bank group control unit 180 receive a command CMD from the command/address decoder 120. The command CMD includes commands WR A and WR B respectively corresponding to the first and second bank groups 131 and 133. Hereinafter, a method of controlling write data for the first bank group 131 will be described. A method of controlling write data for the second bank group 133 is substantially the same as that for the first bank group 131.

The write/read control unit 171 selects the command WR A corresponding to the first bank group 131 in the command CMD and generates a first internal command CMD_A_i as many times as the number of core accesses. The write/read control unit 171 generates a latch control signal 2nd_En_A including pulses respectively corresponding to operation instructions WR A and WR A' in the first internal command CMD_A_i based on the first internal command CMD_A_i and outputs a latch control signal 2nd_En_A to the second latch 175.

Write data DQ includes write data for both the first and second bank groups 131 and 133. The data I/O circuit 160 selects write data WR DATA_A and WR DATA_A' only for the first bank group 131 from the write data DQ to generate first write data DATA_A and outputs the first write data DATA_A to the first bank group control unit 170 corresponding to the first bank group 131.

The latch 173 receives the first write data DATA_A, latches it according to a clock signal CK so that gaps are removed from the first write data DATA_A to generate first latch data DATA_A_1, and outputs the first latch data DATA_A_1 to the second latch 175.

The second latch 175 latches the first latch data DATA_A_1 according to the latch control signal 2nd_En_A so that data items 210, 220, 230, and 240 have the same time space, thereby generating bank group write data DATA_A_2. The second latch 175 outputs the bank group write data DATA_A_2 to the first write/read circuit 141.

The first write/read circuit 141 receives the bank group write data DATA_A_2 from the second latch 175 and outputs it to the first bank group 131. At this time, the writing speed of the bank group write data DATA_A_2 is half of the writing speed of the write data DQ, and therefore, a core access speed can be reduced.

Figure 6A:
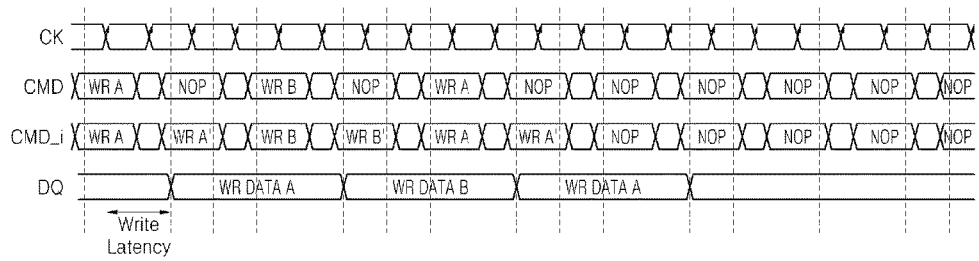
FIG. 6A is a timing chart of a conventional write operation when a burst length is 4, the number of core accesses is 2, a bank group is not used, and tCCD=2.
Figure 6B:
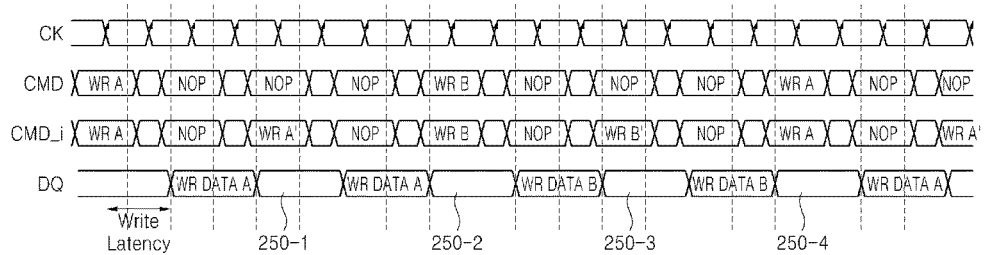
FIG. 6B is a timing chart of a conventional write operation when a burst length is 4, the number of core accesses is 2, a bank group is used, and tCCD=4.
Figure 6C:
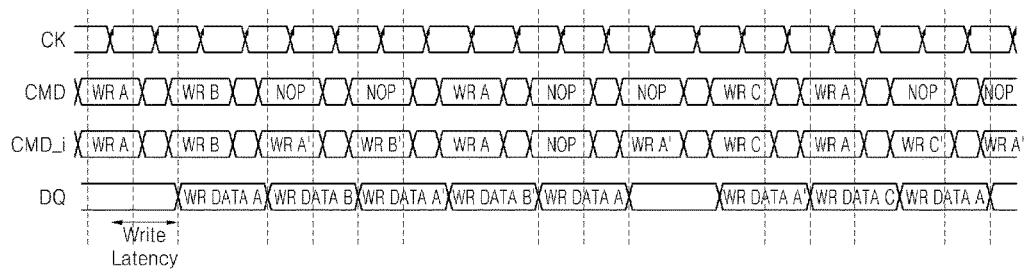
FIG. 6C is a timing chart of a conventional write operation when a burst length is 4, the number of core accesses is 2, a bank group is used, tCCDL=4, and tCCDS=1, 3.

FIGS. 6A through 6C are timing charts of conventional write operations when a burst length is 4 and the number of core accesses is 2. FIG. 6A show a case where a bank group is not used and tCCD=2. FIG. 6B shows a case where a bank group is used and tCCD=4. FIG. 6C shows a case where a bank group is used, tCCDL=4, and tCCDS=1, 3.

Referring to FIG. 6A, since tCCD=2, write commands WR A and WR B are applied at an interval of two clock cycles of a clock signal CK. When there is no bank group, no problems occur in write data DQ even when two core accesses are performed. However, since no bank group is used, a core access speed cannot be decreased.

Referring to FIG. 6B, when tCCD is changed from 2 to 4 using a bank group, the write commands WR A and WR B are applied at an interval of four clock cycles of the clock signal CK. In this case, bubbles 250-1 through 250-4 may occur among the write data DQ.

Referring to FIG. 6C, tCCDL may be set to 4 and tCCDS may be set to 1 and 3 in order to remove the bubbles 250-1 through 250-4. However, data items from different bank groups are interleaved, which complicates the use of data and leads to overhead incurred by a user storing previous data and then binding data again in order to use the interleaved data.

Figure 7:
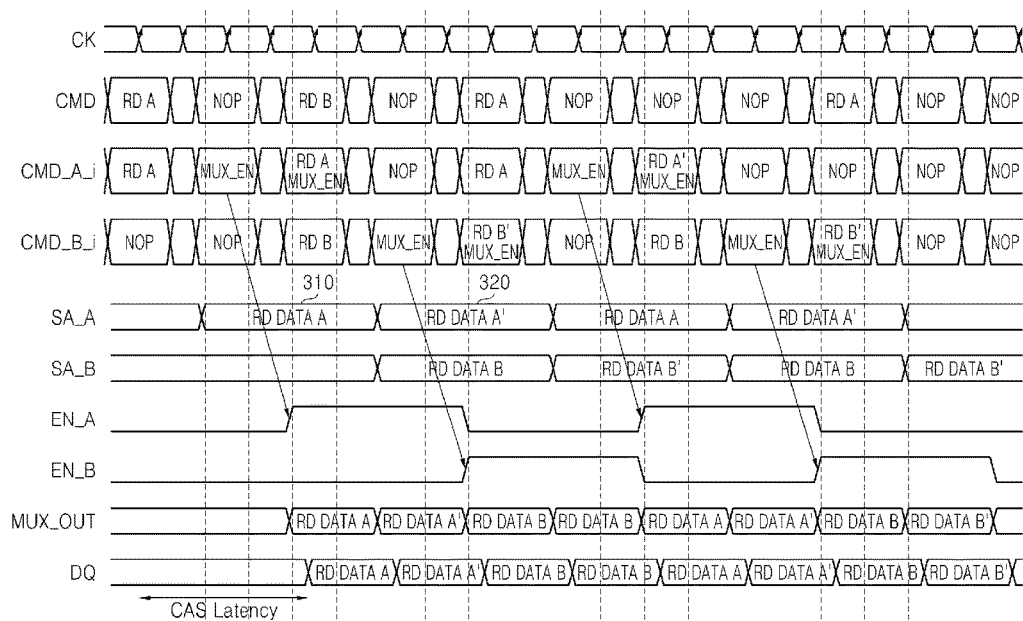
FIG. 7 is a timing chart of a read operation according to some embodiments of the inventive concept.

FIG. 7 is a timing chart of a read operation according to some embodiments of the inventive concept. Referring to FIGS. 2, 3, and 7, the write/read control unit 171 in the first bank group control unit 170 generates a first internal command CMD_A_i based on a command CMD. The first internal command CMD_A_i includes two commands RD A and RD A' which correspond to the repetition of an operation RD A of the command CMD and also includes a MUX enable command MUX_EN. The MUX enable command MUX_EN can be periodically applied in length of 2 cycles of the clock signal CK. The write/read control unit 171 generates and outputs a first MUX control signal EN_A to the MUX 195 based on the MUX enable command MUX_EN.

Meanwhile, a write/read control unit included in the second bank group control unit 180 operates in the same manner as the write/read control unit 171 in the first bank group control unit 170, thereby generating a second internal command CMD_B_i and second MUX control signal EN_B.

According to the first and second internal commands CMD_A_i and CMD_B_i, data is read from each of the first and second bank groups 131 and 133. Read data SA_A and SA_B are input to the MUX 195 through the write/read circuit 140.

The MUX 195 sequentially outputs the read data SA_A and SA_B according to the MUX control signals EN_A and EN_B. The MUX 195 selects the second half of first access data 310 in the first read data SA_A and the first half of second access data 320 in the first read data SA_A according to the first MUX control signal EN_A. The selected part of the first access data 310 has the same length as the selected part of the second access data 320. The MUX 195 selects data from the second read data SA_B in the same manner, thereby generating selected data MUX_OUT. The MUX 195 outputs the selected data MUX_OUT to the data I/O circuit 160. Accordingly, data items in the selected data MUX_OUT have the same time space and are consecutively continued without a gap there between.

Figure 8:
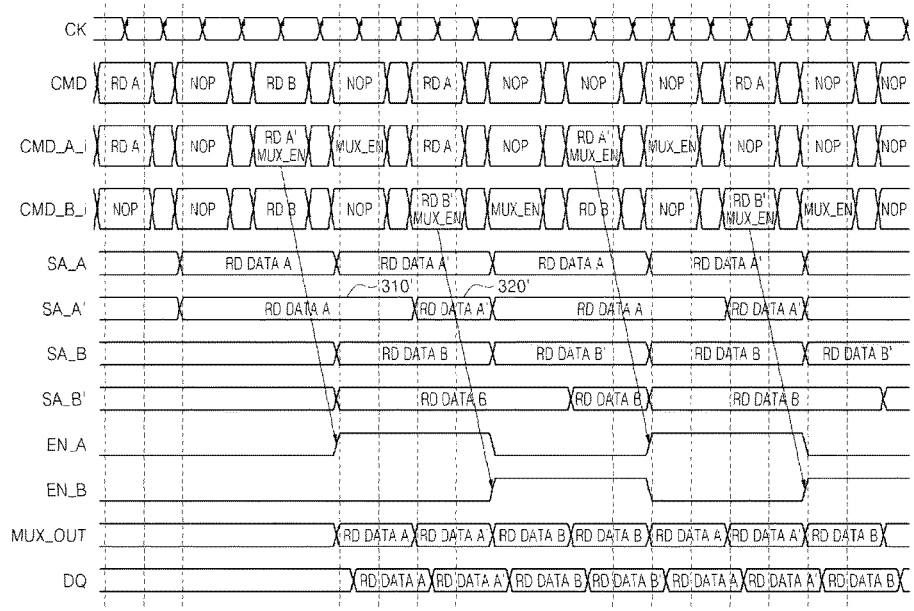
FIG. 8 is a timing chart of a read operation according to other embodiments of the inventive concept.

FIG. 8 is a timing chart of a read operation according to other embodiments of the inventive concept. Referring to FIGS. 4 and 8, the third latch 191 is controlled by the first and second bank group control units 170 and 180 to delay the first access data 310 in each of read data SA_A and SA_B, thereby generating delayed data SA_A' and SA_B'. The third latch 191 outputs the delayed data SA_A' and SA_B' to the MUX 195. At this time, a time by which the first access data 310' is delayed is the same as a time by which the second access data 320' is delayed. Although the delayed data SA_A' and SA_B' are generated by delaying the first access data 310 in the embodiments illustrated in FIG. 8, they may alternatively be generated by delaying the second access data 320.

MUX control signals EN_A and EN_B are synchronized with the read data SA_A and SA_B, respectively. The MUX 195 sequentially selects the delayed data SA_A' and SA_B' according to the MUX control signals EN_A and EN_B, thereby generating selected data MUX_OUT, and outputs the selected data MUX_OUT to the data I/O circuit 160. Accordingly, a part selected from the first access data 310 has the same length as a part selected from the second access data 320, and therefore, data items in the selected data MUX_OUT have the same time space.

Figure 9A:
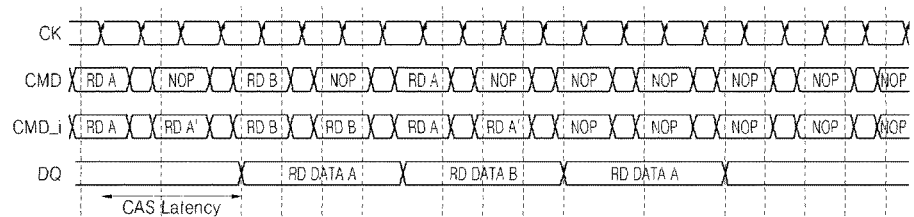
FIG. 9A is a timing chart of a conventional read operation when a burst length is 4, the number of core accesses is 2, a bank group is not used, and tCCD=2.
Figure 9B:
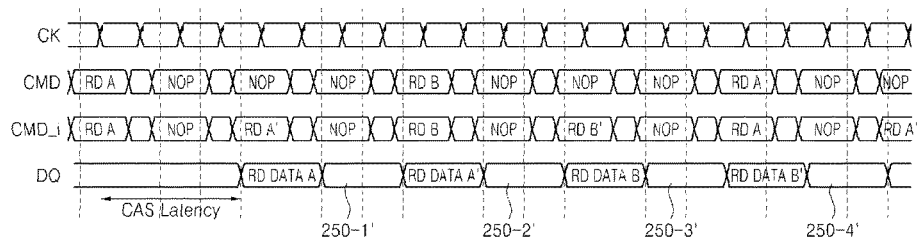
FIG. 9B is a timing chart of a conventional read operation when a burst length is 4, the number of core accesses is 2, a bank group is used, and tCCD=4.
Figure 9C:
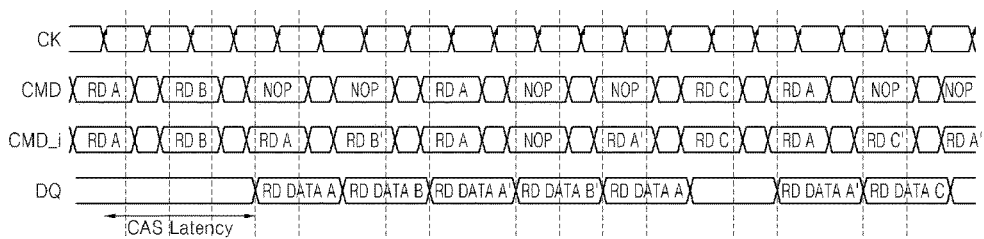
FIG. 9C is a timing chart of a conventional read operation when a burst length is 4, the number of core accesses is 2, a bank group is used, tCCDL=4, and tCCDS=1, 3.

FIGS. 9A through 9C are timing charts of conventional read operations when a burst length is 4 and the number of core accesses is 2. FIG. 9A show a case where there is no bank group and tCCD=2. FIG. 9B shows a case where a bank group is used and tCCD=4. FIG. 9C shows a case where a bank group is used, tCCDL=4, and tCCDS=1, 3.

The cases shown in FIGS. 9A through 9C have the same problems as the cases shown in FIGS. 6A through 6C. Referring to FIG. 9A, since no bank group is used, a core access speed cannot be decreased. Referring to FIG. 9B, when tCCD is changed from 2 to 4 using a bank group, the read commands RD A and RD B are applied at an interval of four clock cycles of the clock signal CLK. In this case, bubbles 250-1' through 250-4' may occur among the write data DQ. Referring to FIG. 9C, tCCDL may be set to 4 and tCCDS may be set to 1 and 3 in order to remove the bubbles 250-1' through 250-4'. However, data items from different bank groups are interleaved, which complicates the use of data and leads to overheads incurred by a user storing previous data and then binding data again in order to use the interleaved data. Those problems do not occur in the embodiments of the inventive concept, and therefore, the speed of a memory device is increased.

Figure 10A:
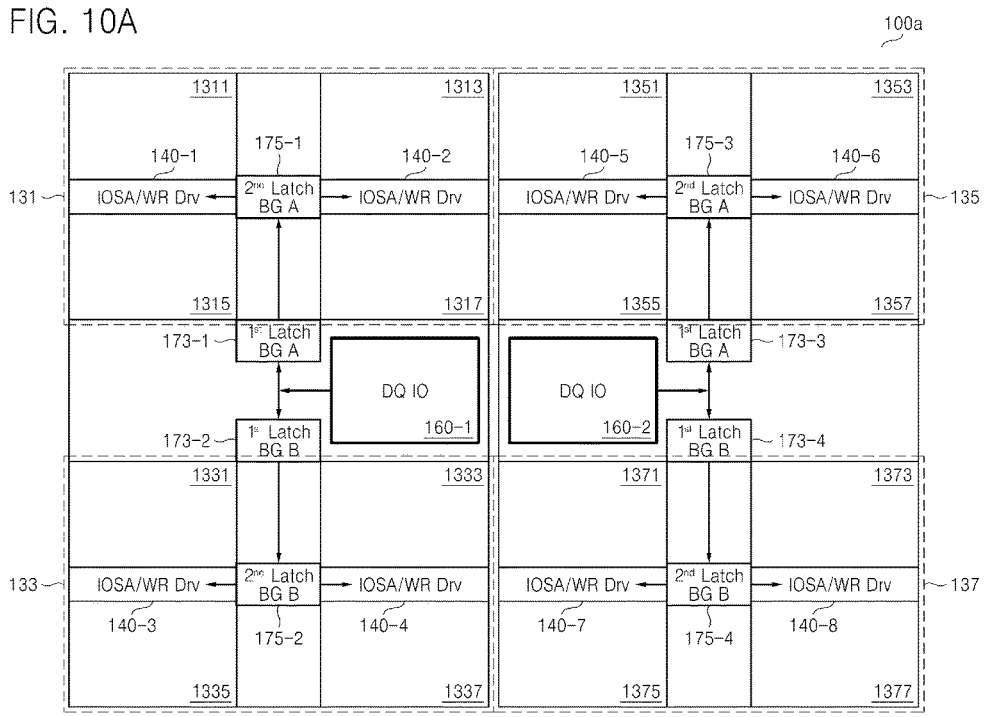
FIG. 10A is a layout of a write path according to some embodiments of the inventive concept.

FIG. 10A is a layout of a write path according to some embodiments of the inventive concept. Referring to FIGS. 2 and 10A, the data I/O circuit 160 included in a memory device 100a may receive write data through a plurality of I/O terminals 160-1 and 160-2.

The memory cell array 130 may include a plurality of bank groups 131, 133, 135, and 137. The first and second bank groups 131 and 133 correspond to the I/O terminal 160-1 and the third and fourth bank groups 135 and 137 correspond to the I/O terminal 160-2. The structure of the first and second bank groups 131 and 133 is the same as that of the third and fourth bank groups 135 and 137. Therefore, only the first and second bank groups 131 and 133 will be described.

The first bank group 131 may include a plurality of memory blocks 1311, 1313, 1315, and 1317. The second bank group 133 may include a plurality of memory blocks 1331, 1333, 1335, and 1337. The write/read circuit 140 may include a plurality of sub write/read circuits 140-1 through 140-4. The sub write/read circuits 140-1 through 140-4 may be positioned among memory blocks 1311 through 1317 and 1331 through 1337.

A second latch 175-1 may be positioned between the sub write/read circuits 140-1 and 140-2 in the first bank group 131 and a second latch 175-2 may be positioned between the sub write/read circuits 140-3 and 140-4 in the second bank group 133. First latches 173-1 and 173-2 may be positioned between the second lathes 175-1 and 175-2 for the respective bank groups 131 and 133. The first latches 173-1 and 173-2 may be connected with the I/O terminal 160-1.

Write data received through the I/O terminal 160-1 is made to continuous and have the same time space by the first latches 173-1 and 173-2 and the second lathes 175-1 and 175-2 and then written to the memory blocks 1311 through 1317 in the first bank group 131 and the memory blocks 1331 through 1337 in the second bank group 133.

Figure 10B:
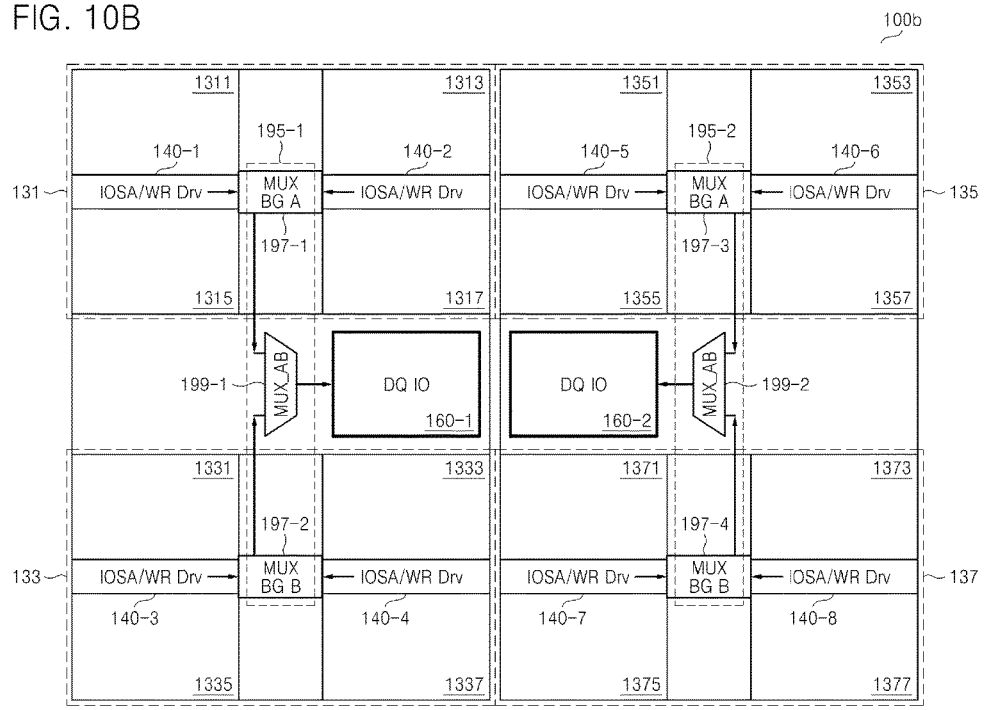
FIG. 10B is a layout of a read path according to some embodiments of the inventive concept.

FIG. 10B is a layout of a read path according to some embodiments of the inventive concept. The layout of a memory device 100b illustrated in FIG. 10B is the same as that of the memory device 100a illustrated in FIG. 10A except for some points, and therefore, differences there between will be primarily described.

Referring to FIGS. 2 and 10B, the MUX 195 may include a first MUX 195-1 sequentially output data read from the first and second bank groups 131 and 133 to the first I/O terminal 160-1 and a second MUX 195-2 sequentially output data read from the third and fourth bank groups 135 and 137 to the second I/O terminal 160-2.

The first MUX 195-1 may include a first sub MUX 197-1 selecting data read from the sub write/read circuit 140-1 or data read from the sub write/read circuit 140-2 in the first bank group 131, a first sub MUX 197-2 selecting data read from the sub write/read circuit 140-3 or data read from the sub write/read circuit 140-4 in the second bank group 133, and a second sub MUX 199-1 selecting data from the first sub MUX 197-1 or data from the first sub MUX 197-2 and outputting the data to the first I/O terminal 160-1. The second sub MUX 199-1 can operate as described in FIG. 7 and FIG. 8, so that each items of the output data from the second sub MUX 199-1 is made to be continuous and has the same time space.

For convenience of the description, the structure for the write operation and the structure for the read operation are separately illustrated in FIGS. 10A and 10B, respectively, but different components at the same position in FIGS. 10A and 10B may be integrated into a single layout. For instance, the second latch 175-1 in FIG. 10A and the first sub MUX 197-1 in FIG. 10B are located at the same position, and therefore, both the second latch 175-1 and the first sub MUX 197-1 may be disposed at the same position.

Figure 11:
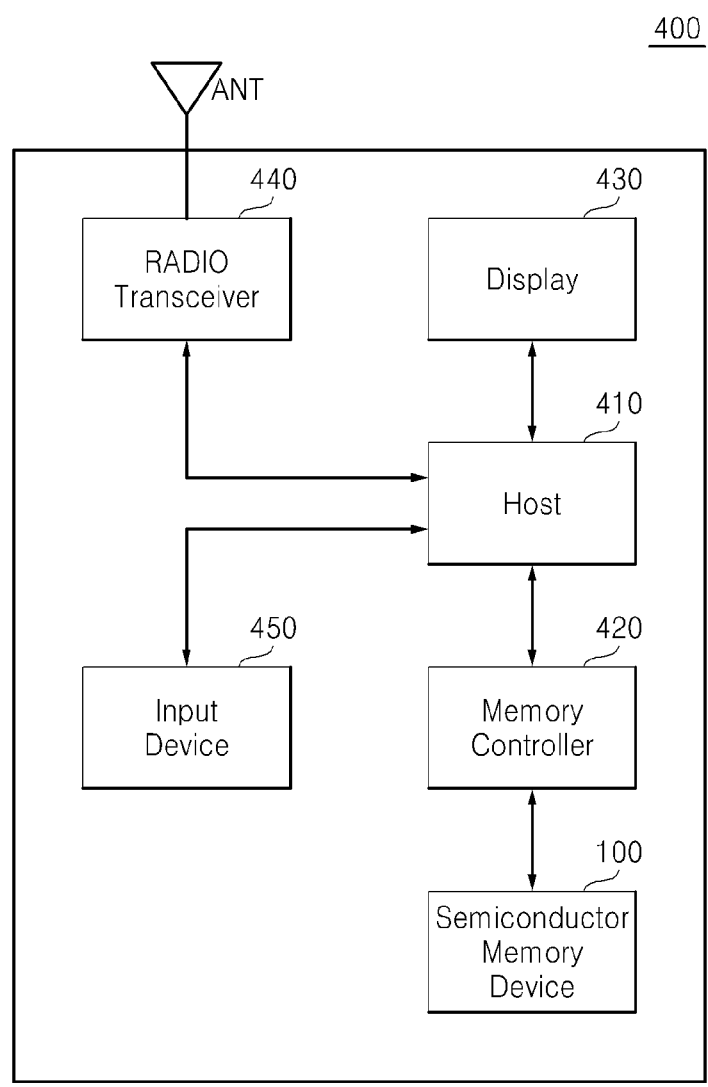
FIG. 11 is a block diagram of a computer system including the semiconductor memory device illustrated in FIG. 1 according to some embodiments of the inventive concept.

FIG. 11 is a block diagram of a computer system 400 including the semiconductor memory device 100 illustrated in FIG. 1 according to some embodiments of the inventive concept. Referring to FIG. 11, the computer system 400 may, as examples, be implemented as a cellular phone, a smart phone, a tablet personal computer (PC), a personal digital assistant (PDA) or a radio communication system.

The computer system 400 includes the semiconductor memory device 100 and a memory controller 420 controlling the operations of the semiconductor memory device 100. The memory controller 420 may control the data access operations, e.g., a write operation and a read operation, of the semiconductor memory device 100 according to the control of a host 410.

The data in the semiconductor memory device 100 may be displayed through a display 430 according to the control of the host 410 and/or the memory controller 420.

A radio transceiver 440 transmits or receives radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 430. The memory controller 420 may program the signals processed by the host 410 to the semiconductor memory device 100. The radio transceiver 440 may also convert signals output from the host 410 into radio signals and outputs the radio signals to an external device through the antenna ANT.

An input device 450 enables control signals for controlling the operation of the host 410 or data to be processed by the host 410 to be input to the computer system 400. The input device 450 may be implemented by a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the semiconductor memory device 100, may be implemented as a part of the host 410 or as a separate chip.

Figure 12:
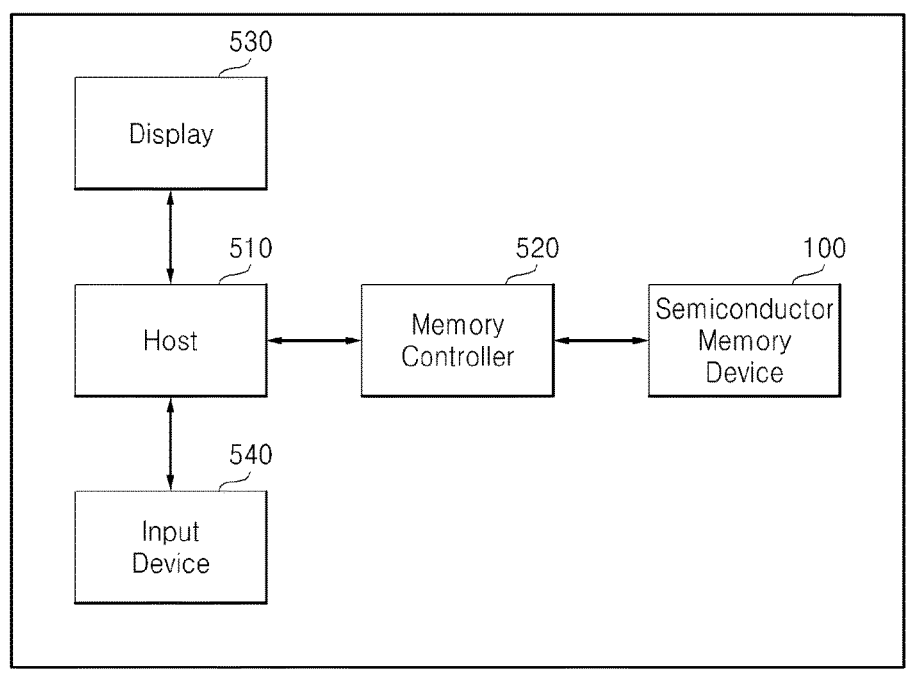
FIG. 12 is a block diagram of a computer system including the semiconductor memory device illustrated in FIG. 1 according to other embodiments of the inventive concept.

FIG. 12 is a block diagram of a computer system 500 including the semiconductor memory device 100 illustrated in FIG. 1 according to other embodiments of the inventive concept. The computer system 500 may be implemented, as examples, as a personal computer (PC), a tablet PC, a net-book, an e-reader, a personal digital assistant (PDA), a portable multimedia player (PMP), an MP3 player, or an MP4 player.

The computer system 500 includes a host 510, the semiconductor memory device 100, a memory controller 520 controlling the data processing operations of the semiconductor memory device 100, a display 530 and an input device 540.

The host 510 may display data stored in the semiconductor memory device 100 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520, which may control the operations of the semiconductor memory device 100, may be implemented as a part of the host 510 or as a separate chip.

Figure 13:
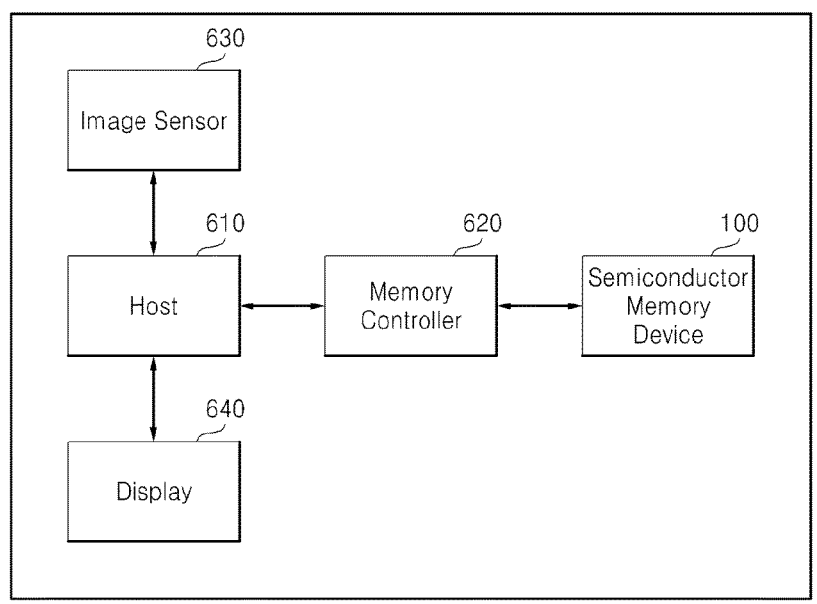
FIG. 13 is a block diagram of a computer system including the semiconductor memory device illustrated in FIG. 1 according to further embodiments of the inventive concept.

FIG. 13 is a block diagram of a computer system 600 including the semiconductor memory device 100 illustrated in FIG. 1 according to further embodiments of the inventive concept. The computer system 600 may be implemented, as examples, as an image processor like a digital camera, a cellular phone equipped with a digital camera, a smart phone equipped with a digital camera, or a tablet PC equipped with a digital camera.

The computer system 600 includes a host 610, the semiconductor memory device 100 and a memory controller 620 controlling the data processing operations, such as a write operation, and a read operation, of the semiconductor memory device 100. The computer system 600 further includes an image sensor 630 and a display 640. The image sensor 630 included in the computer system 600 converts optical images into digital signals and outputs the digital signals to the host 610 or the memory controller 620. The digital signals may be controlled by the host 610 to be displayed through the display 640 or stored in the semiconductor memory device 100 through the memory controller 620.

Data stored in the semiconductor memory device 100 may be displayed through the display 640 according to the control of the host 610 or the memory controller 620. The memory controller 620, which may control the operations of the semiconductor memory device 100, may be implemented as a part of the host 610 or as a separate chip.

Figure 14:
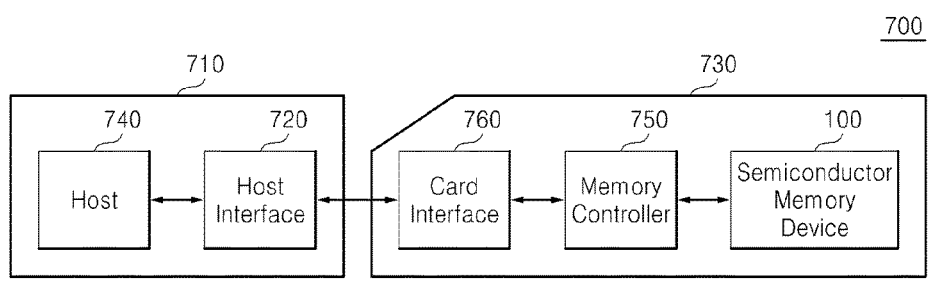
FIG. 14 is a block diagram of a computer system including the semiconductor memory device illustrated in FIG. 1 according to still other embodiments of the inventive concept.

FIG. 14 is a block diagram of a computer system 700 including the semiconductor memory device 100 illustrated in FIG. 1 according to still other embodiments of the inventive concept. The computer system 700 may be implemented, as examples, as a host computer 710 and a memory card or a smart card. The computer system 700 includes the host computer 710 and the memory card 730. The host computer 710 includes a host 740 and a host interface 720. The memory card 730 includes the semiconductor memory device 100, a memory controller 750, and a card interface 760.

The memory controller 750 may control data exchange between the semiconductor memory device 100 and the card interface 760. The card interface 760 may be a secure digital (SD) card interface or a multi-media card (MMC) interface, but the inventive concept is not restricted to the current embodiments. When the memory card 730 is installed in the host computer 710, the card interface 760 may interface the host 740 and the memory controller 750 for data exchange according to a protocol of the host 740.

The card interface 760 may support a universal serial bus (USB) protocol and an interchip (IC)-USB protocol. Here, the card interface 760 may indicate a hardware supporting a protocol used by the host 740, software installed in the hardware, or a signal transmission mode.

When the memory card 730 is connected with the host interface 720 of the host computer 710 such as a PC, a tablet PC, a digital camera, a digital audio player, a cellular phone, a console video game hardware, or a digital set-top box, the host interface 720 may perform data communication with the semiconductor memory device 100 through the card interface 760 and the memory controller 750 according to the control of the host 740.

As described above, according to some embodiments of the inventive concept, a memory device is configured to realize a given burst length even while using a bank group, thereby increasing an operating speed.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. An operating method of a memory device comprising a plurality of bank groups, the method comprising:
   receiving a bank group used signal and storing the bank group used signal in a mode register;
   receiving a first command corresponding to a first bank group of the plurality of bank groups;
   generating first and second internal commands based on the first command;
   receiving a second command corresponding to a second bank group of the plurality of bank groups;
   generating third and fourth internal commands based on the second command;
   receiving a third command corresponding to the first bank group;
   accessing a first data stored in the first bank group, based on the first command;
   accessing a second data stored in the second bank group, based on the second command;
   accessing a third data stored in the first bank group, based on the third command; and
   outputting the first data and the second data by a burst length "b", where "b" is an integer of at least 2,
   wherein the first command and the third command are successive commands for the first bank group,
   wherein a time delay between the first command and the second command is set to 2 clock cycles and a time delay between the first command and the third command is set to 4 clock cycles,
   wherein the accessing the first data comprises reading a first access data and a second access data from the first bank group according to the first and second internal commands, and
   wherein the accessing the second data comprises reading a third access data and a fourth access data from the second bank group according to the third and fourth internal commands.

2. The method of claim 1, wherein the memory device performs "k" core accesses per command, where "b" is 4 and "k" is an integer of at least 2 and at most "b".

3. The method of claim 2, further comprising:
   selecting part of the first access data, part of second access data, part of the third access data and part of the fourth access data; and
   sequentially outputting the selected parts without a bubble.

4. An operating method of a memory device comprising a plurality of bank groups, the method comprising:
   receiving a bank group used signal and storing the bank group used signal in a mode register;
   receiving a first command associated with an access to a first bank group of the plurality of bank groups;
   generating first and second internal commands based on the first command;
   receiving a second command associated with an next access to a second bank group of the plurality of bank groups;
   generating third and fourth internal commands based on the second command;
   accessing a first data stored in the first bank group of the plurality of bank groups, based on the first command;
   accessing a second data stored in the second bank group of the plurality of bank groups, based on the second command; and
   outputting the first data and the second data by a burst length "b", where "b" is an integer of at least 2,
   wherein a time delay between the first command and the second command is set to 2 clock cycles,
   wherein the accessing the first data comprises reading a first access data and a second access data from the first bank group according to the first and second internal commands; and
   wherein the accessing the second data comprises reading a third access data and a fourth access data from the second bank group according to the third and fourth internal commands.

5. The method of claim 4, wherein the outputting the first data and the second data comprises:

sequentially outputting the first access data, the second access data, the third access data and the fourth access data without a bubble.

6. The method of claim 5, wherein the sequentially outputting comprises:

selecting part of the first access data, part of second access data, part of the third access data and part of the fourth access data; and sequentially outputting the selected parts without a bubble.

7. The method of claim 4, wherein the time delay between the first command and the second command is set in the mode register.

8. The method of claim 4, wherein the memory device performs "k" core accesses per command, where "b" is 4 and "k" is an integer of at least 2 and at most "b".

9. The method of claim 8, wherein b=k*n, where "n" is a number of bank groups.

10. The method of claim 9, further comprising setting a value of "n" in the mode register.

* * * * *